(12) United States Patent
Hayashi et al.

(10) Patent No.: US 8,003,282 B2
(45) Date of Patent: Aug. 23, 2011

(54) REFLECTIVE MASK BLANK FOR EUV LITHOGRAPHY, AND SUBSTRATE WITH FUNCTIONAL FILM FOR THE MASK BLANK

(75) Inventors: Kazuyuki Hayashi, Chiyoda-ku (JP); Kazuo Kadowaki, Chiyoda-ku (JP); Takashi Sugiyama, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 110 days.

(21) Appl. No.: 12/483,785

(22) Filed: Jun. 12, 2009

(65) Prior Publication Data

US 2009/0253055 A1 Oct. 8, 2009

Related U.S. Application Data

(63) Continuation of application No. PCT/JP2007/074052, filed on Dec. 13, 2007.

(30) Foreign Application Priority Data

Dec. 15, 2006 (JP) ................................ 2006-338576

(51) Int. Cl.
*G03F 1/00* (2006.01)
(52) U.S. Cl. .......................................................... 430/5
(58) Field of Classification Search ............... 430/5, 322, 430/323; 378/35
See application file for complete search history.

(56) References Cited

U.S. PATENT DOCUMENTS

| | | | |
|---|---|---|---|
| 7,736,821 B2 * | 6/2010 | Hayashi et al. | .................... 430/5 |
| 2007/0160874 A1 | 7/2007 | Hayashi et al. | |
| 2008/0318140 A1 | 12/2008 | Hayashi et al. | |

FOREIGN PATENT DOCUMENTS

| | | |
|---|---|---|
| JP | 2002222764 A | 8/2002 |
| JP | 2003-501823 | 1/2003 |
| JP | 2004320035 A | 11/2004 |
| JP | 2005093723 A | 4/2005 |
| JP | 2005-210093 | 8/2005 |
| JP | 2006049910 A | 2/2006 |
| JP | 2006093454 A | 4/2006 |
| JP | 2006324268 A | 11/2006 |
| WO | WO 2007/069417 A1 | 6/2007 |

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

Provided are a substrate with a conductive film for an EUV mask blank in which the generation of particles due to abrasion between an electrostatic chuck and the substrate is prevented; and a substrate with a multilayer reflective film and an EUV mask blank each employing such a substrate with a conductive film.

A substrate with a conductive film to be used for producing a reflective mask blank for EUV lithography, the conductive film containing chromium (Cr) and nitrogen (N), the average concentration of N in the conductive film being at least 0.1 atomic % and less than 40 atomic %, the crystal state of at least a surface of the conductive film being amorphous, the sheet resistance of the conductive film being at most 27 $\Omega/\square$, and the surface roughness (rms) of the conductive film being at most 0.5 nm.

14 Claims, 1 Drawing Sheet

REFLECTIVE MASK BLANK FOR EUV LITHOGRAPHY, AND SUBSTRATE WITH FUNCTIONAL FILM FOR THE MASK BLANK

TECHNICAL FIELD

The present invention relates to a reflective mask blank (hereinafter referred to as "EUV mask blank" in this specification) for EUV (extreme ultraviolet) lithography to be used for e.g. semiconductor manufacturing, and to a substrate with a functional film to be used for producing the mask blank.

BACKGROUND ART

Heretofore, in the semiconductor industry, photolithography methods using visible light or UV light have been employed as a technique of transferring fine patterns required for forming an integrated circuit constituted by fine patterns, on e.g. a Si substrate. However, the miniaturization of semiconductor devices is rapidly achieved and is brought close to its limitation obtainable by conventional light exposure methods. In the case of light exposure, the resolution limit of a pattern is about a half of the wavelength used for exposure, and it becomes about a quarter of the wavelength used for exposure even if an immersion method is used. The resolution limit is expected to be about 45 nm even by an immersion method using an ArF laser (193 nm). To cope with this problem, as the exposure technique for 45 nm or smaller patterns, EUV lithography, which is an exposure technique using EUV light having a shorter wavelength than that of an ArF laser, is considered to be prospective. In this specification, EUV light means a light beam having a wavelength in a soft X-ray region or vacuum UV region, and specifically, it means a light beam having a wavelength of about from 10 to 20 nm, particularly about 13.5 nm±0.3 nm.

Since EUV light tends to be absorbed by all materials and the refractive indexes of all materials for EUV light are close to 1, it is not possible to use a refractive optical system such as ones used for the conventional lithography methods using visible light or UV light. For this reason, in EUV lithography, a reflective optical system, that is, a reflective photomask and mirrors, are employed.

A mask blank is an unpatterned laminate for producing a photomask. A mask blank for a reflective photomask has a structure that a reflective layer reflecting EUV light and an absorptive layer absorbing EUV light are formed on a substrate of e.g. glass in this order. As the reflective layer, a multilayer reflective film is usually employed, which comprises high refractive index layers and low refractive index layers that are alternately laminated, and which has high light beam reflectivity when a light beam is incident into a surface of the layer, more specifically, high light beam reflectivity when EUV light is incident into a surface of the layer. For the absorptive layer, a material having high absorption coefficient for EUV light, specifically, for example, a material containing Cr or Ta as a main component, is employed.

The multilayer reflective film and the absorptive layer are formed by using an ion beam sputtering method or a magnetron sputtering method. At the times of forming the multilayer reflective film and the absorptive layer, the substrate is supported by a supporting means. Examples for the means of supporting a substrate include a mechanical chuck and an electrostatic chuck. However, from the viewpoint of particle generation, an electrostatic chuck is preferably employed. Further, in a mask patterning process or mask handling for exposure, an electrostatic chuck is employed as the means for supporting a substrate. However, in a case of a substrate such as a glass substrate having a low dielectric constant and a low conductivity, it is necessary to apply a high voltage to obtain a clamping force equivalent to that required for clamping a silicon wafer, and there is a risk of causing a dielectric breakdown. In order to solve this problem, Patent Document 1 describes a mask substrate having a rear surface coating (conductive film) formed of a material, such as Si, Mo, chromium oxynitride (CrON) or TaSi other than commonly used Cr, which has a higher dielectric constant and a higher conductivity than those of glass substrate, as a layer for promoting the electrostatic chucking of the substrate.

However, in the mask substrate described in Patent Document 1, since the CrON film has a low adhesion to the mask substrate, there is a problem that peeling occurs between the glass substrate and the CrON film at the time of forming a multilayer reflective film or an absorptive film with the result that particles are formed. Particularly, in the vicinity of the interface between the electrostatic chuck and the CrON film, peeling of the film tends to be caused by a force applied to the vicinity of the interface between the substrate and the electrostatic chuck, which is produced by rotation of the substrate.

Further, in the mask substrate described in Patent Document 1, a conductive film is formed on the entire region of one surface as well as chamfers and side faces of the substrate. Accordingly, the adhesive forces of the film to the chamfers and side faces of the substrate are particularly weak since the conductive film is obliquely formed on the chamfers and side faces, and the peeling of the film tends to be caused by warpage of the substrate at a time of clamping by an electrostatic chuck or by contact with an end effecter of a robot arm.

Further, in the mask substrate described in Patent Document 1, since oxygen (O) and carbon (C) are contained in large amounts in a surface of the CrON conductive film, abnormal discharge may occur in the process of forming a multilayer reflective film or absorptive film in some film-forming conditions.

Such peeling of a conductive film at a time of e.g. clamping by an electrostatic chuck (at a time of film-forming) or particle generation due to abnormal discharge at a time of film-forming, increases defects in a product (a substrate with a multilayer reflective film, a reflective mask blank for exposure or a reflective mask for exposure), and prevents production of high quality product. In a case of pattern transfer by using a conventional transmission mask for exposure, since the wavelength of exposure light is relatively long in a UV region (about 157 to 248 nm), even if a concave or convex defect is formed on a mask surface, a critical problem is unlikely caused, and accordingly, the generation of particles at a time of film-forming has not been recognized as a major problem. However, in a case of using light having a short wavelength such as EUV light as exposure light, even a fine concave or convex defect on a mask surface has a major influence on pattern transfer, and accordingly, the generation of particles cannot be ignored.

In order to solve the above problems, Patent Document 2 discloses a substrate with a multilayer reflective film in which particle generation due to peeling of a conductive film at a time of clamping by an electrostatic chuck or generation of particles due to abnormal discharge are prevented; a high quality reflective mask blank for exposure having few surface defects due to particles; and a high quality reflective mask for exposure having no pattern defect due to particles.

In order to solve the above problems, the substrate with a multilayer reflective film described in Patent Document 2 comprises a conductive film wherein the material forming the conductive film changes in the thickness direction of the conductive film so that a substrate side of the conductive film contains nitrogen (N) and a surface side of the film contains at least one of oxygen (O) and carbon (C). With respect to the reason why the conductive film has such a structure, Patent Document 2 describes that nitrogen (N) contained in the substrate side of the conductive film improves the adhesion of the conductive film to the substrate to prevent the conductive film from peeling, and that nitrogen reduces the film stress of the conductive film to allow increase of the attractive force between an electrostatic chuck and the substrate. Further, at least one of oxygen (O) and carbon (C) contained in the surface side of the conductive film increases the surface roughness of the conductive film to an appropriate level, to increase attractive force between an electrostatic chuck and the substrate at a time of clamping by the electrostatic chuck, to thereby prevent abrasion between the electrostatic chuck and the substrate. Here, oxygen (O) contained in the conductive film roughens the surface roughness (increases the surface roughness) to an appropriate level, and increases the attractive force between the electrostatic chuck and the substrate, and carbon (C) contained in the conductive film decreases the specific resistance of the conductive film to thereby improve the attractive force between the electrostatic chuck and the substrate, according to this document.

Here, in the substrate with a multilayer reflective film described in Patent Document 2, a metal material contained in the conductive film is at least one type selected from the group consisting of chromium (Cr), tantalum (Ta), molybdenum (Mo) and silicon (Si), and among these, chromium (Cr) is preferred. When the conductive film is made of a material containing chromium (Cr), the content of nitrogen (N) in the substrate side of the conductive film is preferably from 1 to 60 atomic % according to the document. Further, in a case of CrN, the content of nitrogen (N) is preferably from 40 to 60 atomic % according to the document. Meanwhile, the content of oxygen (O) in the surface side of the conductive film is preferably from 0.1 to 50 atomic %, and the content of carbon (C) is preferably from 0.1 to 10 atomic % according to this document.

Patent Document 1: JP-A-2003-501823
Patent Document 2: JP-A-2005-210093

DISCLOSURE OF THE INVENTION

Problems to be Solved by the Invention

The present inventors have discovered that in order to prevent the generation of particles at a time of film-forming, particularly, the generation of particles caused by abrasion between an electrostatic chuck and a substrate, it is effective to improve contact between the electrostatic chuck and the substrate with a conductive film, and for this purpose, it is effective to decrease the sheet resistance of the conductive film, and to decrease the surface roughness of the conductive film, and preferably, to reduce the sheet resistance of the conductive film to a predetermined value or lower and to reduce the surface roughness of the conductive film to a predetermined value or lower.

In the substrate with a multilayer reflective film described in Patent Document 2, at least one of oxygen (O) and carbon (C) contained in a surface side of a conductive film produces an appropriately roughened state in the surface of the conductive film, to thereby increase attractive force between an electrostatic chuck and the substrate into contact at a time of clamping by an electrostatic chuck, and to prevent abrasion between the electrostatic chuck and the substrate. However, there is a problem that if abrasion has already been occurred, the presence of large surface roughness tends to cause peeling or chipping off of the film to generate particles. Further, when the surface roughness is large, particles (caused from the material of electrostatic chuck or material such as Mo or Si of the film to be formed) on an electrostatic chuck tend to adhere to the conductive film at a time of electrostatic chucking, and since such particles are hard to be cleaned off, there occurs a problem that these particles drop in subsequent steps (transfer, cleaning or inspection) to cause new defects.

Further, when the substrate side of the conductive film is CrN, since the content of nitrogen (N) is from 40 to 60 atomic %, the sheet resistance of the conductive film does not become sufficiently low, and it is not possible to sufficiently increase the clamping force by the electrostatic chuck. As a result, it is not possible to sufficiently increase the contact between the electrostatic chuck and the substrate with a conductive film.

The present invention has been made based on the above knowledge, and it is an object of the present invention to provide a substrate with a conductive film for EUV mask blank wherein generation of particles at a time of film-forming, particularly the generation of particles caused by abrasion between an electrostatic chuck and a substrate, is prevented.

Further, it is an object of the present invention to provide a substrate with a multilayer reflective film for EUV mask blank and an EUV mask blank, which employ such a substrate with a conductive film.

Means for Solving the Problems

To achieve the above objects, the present invention provides a substrate with a conductive film (hereinafter referred to as "substrate with a conductive film of the present invention" in this specification) adapted to be used for producing a reflective mask blank for EUV lithography, the conductive film containing chromium (Cr) and nitrogen (N), the average concentration of N in the conductive film being at least 0.1 atomic % and less than 40 atomic %, the crystal state of at least a surface of the conductive film being amorphous, the sheet resistance of the conductive film being at most 27Ω/□, and the surface roughness (rms) of the conductive film being at most 0.5 nm.

In the substrate with a conductive film of the present invention, the conductive film may further contain at least one element selected from the group consisting of Al, Ag, B, Co, Cu, Fe, Hf, In, Mo, Ni, Nb, Si, Ta, Ti, Zn and Zr in an amount of from 1 to 20 atomic % (average concentration) in total.

In the substrate with a conductive film of the present invention, it is preferred that the average concentration of oxygen (O) in the conductive film be at most 15 atomic %, and the average concentration of carbon (C) in the conductive film be at most 10 atomic %.

Further, in the substrate with a conductive film of the present invention, it is preferred that the thickness of the conductive film be from 50 to 200 nm.

In the substrate with a conductive film of the present invention, the conductive film may be a gradient composite film wherein the N concentration changes in the thickness direction of the conductive film so that the N concentration on the substrate side is low and the N concentration on the surface side is high.

Further, the present invention provides a substrate with multilayer reflective film for a reflective mask blank for EUV lithography (hereinafter referred to as "substrate with a multilayer reflective film of the present invention" in this specification), which is the substrate with a conductive film of the present invention further comprising a multilayer reflective film formed on a surface opposite from a surface on which the conductive film is formed.

Further, the present invention provides a reflective mask blank for EUV lithography (hereinafter referred to as "EUV mask blank of the present invention" in this specification) which is the substrate with a multilayer reflective film of the present invention further comprising an absorptive layer formed on the multilayer reflective film.

Further, the present invention provides a reflective mask for EUV lithography (hereinafter referred to as "EUV mask of the present invention" in this specification) produced by patterning the EUV mask blank of the present invention.

Effects of the Invention

In the substrate with a conductive film of the present invention, the surface roughness of a surface of conductive film is small, which improves the contact with an electrostatic chuck. Further, the sheet resistance of the conductive film is low, which improves the clamping force by the electrostatic chuck. As a result, when the substrate with a conductive film is attached to an electrostatic chuck and used for producing an EUV mask blank, its contact with the electrostatic chuck is improved. When the contact with the electrostatic chuck is improved, the generation of particles by abrasion with the electrostatic chuck is prevented.

Further, good contact with the electrostatic chuck improves the thermal conductivity between the substrate with a conductive film and the electrostatic chuck, and improves the cooling performance of the substrate in a mask patterning process or exposure.

Further, since the crystal state of at least a surface of the conductive film is amorphous, the conductive film is hard to be oxidized and the change in stress in the conductive film over time is small. As a result, it is expected that the deterioration of pattern accuracy be suppressed and the lifetime of the produced mask increase.

Further, when the average concentration of oxygen is at most 15 atomic % and the average concentration of carbon is at most 10 atomic % in the conductive film, the sheet resistance of the conductive film becomes low and the roughening of the surface does not occur. Accordingly, the contact between the substrate and an electrostatic chuck is improved, and the generation of particles due to the abrasion between the electrostatic chuck and the substrate is prevented. Further, the adhesion of particles on the electrostatic chuck to the conductive film at a time of electrostatic chucking, is prevented.

In the substrate with a conductive film of the present invention wherein the conductive film is a gradient composite film, the N concentration on the surface side of the conductive film is high, whereby the conductive film is hard to be oxidized and the change in stress in the conductive film over time is small. As a result, it is expected that deterioration of pattern accuracy be suppressed, and the lifetime of mask increase. Meanwhile, since the N concentration on a substrate side of the conductive film is low, the adhesion of the conductive film to the substrate is expected to be further improved.

EXPLANATION OF NUMERALS

1: Substrate
2: Conductive film
3: Multilayer reflective film
4: Absorptive layer

BEST MODE FOR CARRYING OUT THE INVENTION

Now, the present invention will be described with reference to the drawings.

Figure 1:
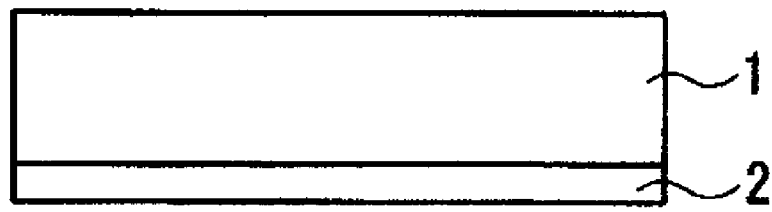
FIG. 1 is a schematic view of a substrate with a conductive film of the present invention.

FIG. 1 is a schematic view of a substrate with a conductive film of the present invention. In FIG. 1, the substrate 1 for film-forming has one surface on which a conductive film 2 is formed. At a time of forming a multilayer reflective film and an absorptive layer on the substrate 1, the substrate 1 is fixed to an electrostatic chuck via the conductive film 2. As described later, the multilayer reflective film and the absorptive layer are formed on an opposite side (film-forming surface) of the substrate 1 from a surface on which the conductive film 2 is formed. In short, the conductive film 2 is formed on a rear surface side of the substrate 1 from the film-forming surface.

The substrate with a conductive film of the present invention is characterized in that the conductive film 2 contains chromium (Cr) and nitrogen (N), and the average concentration of N in the conductive film 2 is at least 0.1 atomic % and less than 40 atomic %, and the crystal state of at least a surface of the conductive film 2 is amorphous, and the sheet resistance of the conductive film 2 is at most 27Ω/☐, and the surface roughness (rms) of the conductive film 2 is at most 0.5 nm.

In this specification, "the N concentration in the conductive film 2" means the atomic concentration of N in the conductive film 2. The N concentration of conductive film 2 can be measured, for example, by an X-ray photoelectron spectrometer.

Here, with respect to the average concentration of N in the conductive film 2, it is necessary that the average concentration of N be at least 0.1 atomic % and less than 40 atomic % as an average in the entire portion of the conductive film 2, but it is not necessary that the concentration of N be at least 0.1 atomic % and less than 40 atomic % in every portion of the conductive film 2. For example, so long as the average concentration of N is at least 0.1% and less than 40% as an average in the entire conductive film 2, the conductive film 2 may have a portion where the N concentration is less 0.1 atomic %, and the conductive film 2 may have a portion containing no N.

Here, the average concentration of N in the conductive film 2 can be estimated by sputtering off the film surface and measuring its profile in a depth direction by use of an X-ray photoelectron spectrometer.

When the average concentration of N in the conductive film 2 is within the above range, Cr and N form a compound (CrN) in the conductive film 2 and the crystal state of at least a surface of the conductive film 2 becomes amorphous. When the crystal state of at least a surface of the conductive film 2 becomes amorphous, the surface roughness of the surface of the conductive film 2 decreases. As a result, the contact to an electrostatic chuck is improved, and the generation of particles due to abrasion between the electrostatic chuck and the conductive film is prevented.

In this specification, "crystal state is amorphous" means not only a state of amorphous structure containing no crystal structure but also a state of amorphous structure having a fine crystal structure. The amorphous crystal state of the conductive film 2, which is a crystal state having an amorphous structure or fine crystal structure, can be confirmed by an X-ray diffraction (XRD) method. When the crystal state of the conductive film 2 has an amorphous structure or fine crystal structure, the diffraction curve obtained by an XRD measurement includes no sharp peak.

When the crystal state of at least a surface of the conductive film 2 has an amorphous structure or fine crystal structure, the surface of the conductive film 2 is excellent in smoothness. Here, in the conductive film 2, the crystal state of at least the surface has to be amorphous, but the crystal state of the entire conductive film 2 is not necessarily amorphous. For example, the crystal state on a side of the conductive film 2 facing to the substrate 1 is not necessarily amorphous.

Here, the surface of the conductive film 2 means, a surface of the conductive film 2 in FIG. 1, that is, a face of the conductive film 2 on the opposite side from a face (a substrate 1 side face) in contact with the substrate 1, which is a face in contact with an electrostatic chuck when the substrate with a conductive film is fixed to the electrostatic chuck.

In the conductive film 2, it is preferred that the crystal state in a portion within 10 nm from the surface in the thickness direction be amorphous, and it is more preferable that the crystal state in a portion within 30 nm from the surface in the thickness direction be amorphous. Further, provided that the total thickness of the conductive film 2 is L (nm), it is preferred that the crystal state of a portion within at least 0.05 L from the surface be amorphous, and it is more preferable that the crystal state of a portion within 0.1 L from the surface be amorphous.

If the average concentration of N in the conductive film 2 is less than 0.1 atomic %, it is not possible that the crystal state of at least the surface of the conductive film 2 becomes amorphous. Namely, the crystal state of the surface of the conductive film becomes crystalline, that is a state having a crystal structure, and accordingly, surface roughness in the surface of conductive film 2 becomes large. As a result, contact with an electrostatic chuck decreases, and due to abrasion between the electrostatic chuck and the conductive film, particles tend to be generated. Further, if the average concentration of N in the conductive film 2 is less than 0.1 atomic %, the surface hardness of the conductive film 2 decreases, which promotes the particle generation due to abrasion between the electrostatic chuck and the conductive film. Further, if the average concentration of N in the conductive film 2 is less than 0.1 atomic %, the chemical durability of the conductive film 2 tends to decrease.

On the other hand, when the average concentration of N in the conductive film 2 is at least 40 atomic %, the crystal state of at least a surface of the conductive film 2 does not become amorphous. Namely, since the crystal state of a surface of the conductive film 2 becomes crystalline, surface roughness of the conductive film 2 becomes large. Further, when the average concentration of N in the conductive film 2 is at least 40 atomic %, the sheet resistance of the conductive film 2 increases and the clamping force by an electrostatic chuck decreases, whereby the contact with the electrostatic chuck decreases, and due to abrasion between the electrostatic chuck and the conductive film, particles tend to be generated.

Here, the present inventors have discovered that when the average concentration of N in the conductive film 2 is at least 40 atomic %, the crystal state in a surface of the conductive film 2 becomes crystalline, but when the average concentration of N is further increased, the crystal state of the conductive film 2 becomes amorphous. Here, in this case, since the film quality becomes rough, the surface roughness of the film of the conductive film 2 becomes large. Furthermore, since the sheet resistance further increases in this case, such a film is not preferable as a conductive film.

The average concentration of N in the conductive film 2 is preferably at least 10 atomic % and less than 40 atomic %, more preferably from 15 to 36 atomic %.

In a substrate with a conductive film, in a normal case where the film is Cr, since Cr is an easily oxidizable metal, oxygen atoms or carbon atoms are inevitably contained in the film even if the film is formed by a film-forming process (film-forming using argon only) without intentionally using oxygen or carbon. In the present invention, the average concentration of oxygen (O) in the conductive film 2 is preferably at most 15 atomic %, more preferably at most 10 atomic %, still more preferably at most 5 atomic %. Further, the average concentration of carbon (C) in the conductive film 2 is preferably at most 10 atomic %, more preferably at most 5 atomic %, still more preferably at most 3 atomic %. Here, the conductive film 2 preferably satisfies both of the above ranges of the average concentrations of oxygen and carbon.

Here, the average concentrations of O and C in the conductive film 2 can be measured by e.g. an X-ray photoelectron spectrometer.

In the conductive film 2, when the average concentration of O is at most 15 atomic % and the average concentration of C is at most 10 atomic %, the sheet resistance of the conductive film becomes low. This construction provides a merit that contact with an electrostatic chuck is improved, and the particle generation due to abrasion between the electrostatic chuck and a substrate is prevented.

The conductive film 2 may contain at least one element (hereinafter referred to as "(an)other element(s)" in this specification) selected from the group consisting of Al, Ag, B, Co, Cu, Fe, Hf, In, Mo, Ni, Nb, Si, Ta, Ti, Zn and Zr, in addition to Cr and N. When the conductive film 2 contains these elements, there expected to be such merits that the crystal state of at least a surface of the conductive film 2 tends to be amorphous or the surface roughness of the conductive film 2 becomes small. A more preferable element to be added is Ta or Mo from the viewpoint of chemical resistance.

One type of these elements may be contained in the conductive film 2, or at least two types of them may be contained in the film. In any of these cases, the average concentration of the above other elements is within a range not adversely affecting properties of the conductive film 2. From this viewpoint, the average concentration of the above other elements in the conductive film 2 is at most 20 atomic % in total. The average concentration of the above other elements in the conductive film 2 is preferably at most 18 atomic % in total, more preferably at most 15 atomic % in total.

When the conductive film 2 has the above construction, it has a low sheet resistance of at most 27Ω/□. When the sheet resistance of the conductive film 2 is low, the clamping force by the electrostatic chuck increases. As a result, the contact with the electrostatic chuck increases, and the generation of particles due to abrasion between the electrostatic chuck and the conductive film is prevented. The sheet resistance of the conductive film 2 is more preferably at most 25Ω/□, still more preferably at most 23Ω/□, furthermore preferably at most 20Ω/□. Further, the sheet resistance of the conductive film 2 is typically preferably at least 3Ω/□, particularly preferably at least 5 Ω/□.

When the conductive film 2 has the above construction, the surface roughness of the conductive film 2 is as small as at most 0.5 nm in terms of rms (root mean square). When the surface roughness of the conductive film is small, the contact with an electrostatic chuck becomes high, and the generation of particles due to abrasion between the electrostatic chuck and the conductive film is prevented. The surface roughness of the conductive film 2 is more preferably at most 0.4 nm, still more preferably at most 0.3 nm in terms of rms. The surface roughness of the conductive film 2 is typically preferably at least 0.01 nm.

The conductive film 2 preferably has a surface hardness of at least 7.5 GPa. When the surface hardness of the conductive film 2 is at least 7.5 GPa, the conductive film 2 is excellent in surface hardness, and when a substrate with the conductive film is fixed to an electrostatic chuck for the purpose of producing an EUV mask blank, the film has an excellent effect of preventing the generation of particles due to abrasion between the electrostatic chuck and the conductive film. Here, the method for measuring the surface hardness of the conductive film 2 is not particularly limited, and a known method, specifically, e.g. a Vickers hardness test, a Rockwell hardness test, a Brinell hardness test or a nano-indentation test may be employed. Among these, a nano-indentation test is widely used for measuring the surface hardness of thin films. Here, in Examples to be described later, the surface hardness of the conductive film 2 was measured by a nano-indentation test.

The surface hardness of the conductive film 2 is preferably at least 12 GPa, particularly preferably at least 15 GPa.

Further, as the difference between the hardness of an electrostatic chuck to be used and the hardness of the conductive film is smaller, the generation of particles due to abrasion can be more effectively prevented. Accordingly, the hardness of the conductive film is preferably within a range of ±4.5 GPa with respect to the hardness of an electrostatic chuck to be used.

As described above, it is sufficient that the average concentration of N in the entire conductive film 2 be at least 0.1 atomic % and less than 40 atomic %, and the conductive film 2 may contain a portion having a N concentration of less than 1 atomic % or a portion containing no N. Namely, in the conductive film 2, N may be unevenly concentrated on a particular portion. For example, N may be concentrated on a surface side of the conductive film 2. In this case, the N concentration of the conductive film 2 on the substrate 1 side is low, and the N concentration on the surface side is high. On the contrary, N may be concentrated on the substrate side of the conductive film 2. In this case, the N concentration in the conductive film 2 on the substrate 1 side is high, and N concentration on the surface side is low.

Here, in the substrate with a conductive film of the present invention, in order to efficiently exhibit the effect of N contained in the conductive film 2, that is, an effect that the crystal state of at least a surface of the conductive film 2 becomes amorphous and the surface roughness of the conductive film 2 becomes small, the conductive film 2 is preferably a gradient composite film (hereinafter referred to as "gradient composite film" in this specification) in which the N concentration changes along the thickness direction of the conductive film 2 so that the N concentration on the substrate side is low and the N concentration on the substrate 1 side is high. Here, when the conductive film 2 is such a gradient composite film, the following effects are expected besides the above effect.

Since the N concentration of the conductive film 2 on the surface side is high, the conductive film is not easily oxidized, and the change of stress in the conductive film over time becomes small. As a result, the deterioration of pattern accuracy is suppressed, and the lifetime of the mask increases.

Meanwhile, since the N concentration of the conductive film on the substrate side is low, the adhesion of the conductive film to the substrate is expected to be further improved.

In this specification, the "gradient composite film" includes not only a conductive film (hereinafter referred to as "narrowly defined composite film") having a structure wherein the N concentration in the conductive film 2 continuously changes along the thickness direction of the conductive film 2, but also a conductive film having a structure that N is concentrated on the surface side. Accordingly, the "gradient composite film" may be a conductive film (hereinafter referred to also as a "conductive film having a lamination structure") having a structure wherein a plurality of layers having different N concentrations are laminated. Here, in this case, a layer having a low N concentration is laminated on the substrate side and a layer having a high N concentration is laminated on the surface side. Here, in such a conductive film having a lamination structure, the number of the layers is not particularly limited. Accordingly, it may be two layers or three or more layers.

Here, so long as the average concentration of N is at least 0.1 atomic % and less than 40 atomic % in the entire conductive film 2, the gradient composite film may contain a portion containing no N on the substrate 1 side. In this case, such a narrowly defined composite film has the following structure.

A portion of the conductive film 2 in the vicinity of the substrate 1 contains no N.

Portions of the conductive film 2 other than the vicinity of the substrate 1 contain N.

The N concentration in the conductive film 2 continuously changes along the thickness direction of the conductive film 2.

The average concentration of N in the entire conductive film 2 is at least 0.1 atomic % and less than 40 atomic %.

Further, when the conductive film 2 has a lamination structure (two layers), it has the following structure.

A layer of the conductive film 2 on the substrate 1 side contains no N.

A layer of the conductive film 2 on the surface side contains N.

The average concentration of N in the entire conductive film 2 is at least 0.1 atomic % and less than 40 atomic %.

Further, when the conductive film 2 has a lamination structure of at least 3 layers, it has the following structure.

The layer of the conductive film 2 closest to the substrate 1 contains no N.

Layers of the conductive film 2 other than the layer closest to the substrate 1 contains N.

Layers containing N are laminated so that the N concentration increases from the substrate 1 side towards the surface side.

The average concentration of N in the entire conductive film 2 is at least 0.1 atomic % and less than 40 atomic %.

In the gradient composite film, the N concentration in a portion (hereinafter referred to as "substrate vicinity portion" in this specification) within 5 nm from the face on the substrate 1 side in the thickness direction is preferably at most 15 atomic %. When the N concentration in the substrate vicinity portion is at most 15 atomic %, the film is excellent in adhesion with the substrate 1. The N concentration in the substrate vicinity portion is more preferably at most 10 atomic %, still more preferably at most 5 atomic %, and it is particularly preferable that the substrate vicinity portion substantially contain no N.

Further, provided that the total film thickness of the conductive film 2 is L (nm), the above substrate vicinity portion is preferably a portion within 0.05 L from the face on the side of the substrate 1.

In the gradient conductive film, the N concentration in a portion (hereinafter referred to as "surface vicinity portion" in this specification) within at least 5 nm from the surface in the thickness direction is preferably at least 0.1 atomic % and less than 40 atomic %. When the N concentration in the surface vicinity portion is at least 0.1 atomic % and less than 40 atomic %, the surface roughness of the conductive film 2 becomes small. The N concentration in the surface vicinity portion is more preferably at least 10 atomic % and less than 40 atomic %, particularly preferably from 15 to 35 atomic %.

In the gradient composite film, the surface vicinity portion is preferably a portion within at least 50 nm in the thickness direction, more preferably a portion within 90 nm in the thickness direction from the surface.

Further, provided that the total film thickness of the conductive film 2 is L (nm), the above surface vicinity portion is preferably a portion within at least 0.05 L from the surface, more preferably a portion within at least 0.1 L from the surface.

In the substrate with a conductive film of the present invention, the film thickness L of the conductive film 2 is preferably from 50 to 200 nm. If the film thickness L of the conductive film 2 is less than 50 nm, the clamping force at a time of fixing the substrate with a conductive film 2 to an electrostatic chuck may be insufficient since the film thickness of the conductive film 2 is small. Further, there is a risk that a dielectric breakdown of the substrate 1 may occur when the substrate with a conductive is fixed to the electrostatic chuck and a high voltage is applied to the chuck.

When the film thickness L of the conductive film 2 exceeds 200 nm, increase of the film thickness does not contribute to improve the clamping force anymore, and the time required for forming the conductive film 2 increases, and the cost for forming the conductive film 2 increases. Further, since the film thickness of the conductive film 2 is needlessly large, the possibility of peeling of the film increases.

The film thickness of the conductive film 2 is more preferably from 50 to 150 nm, still more preferably from 50 to 100 nm, particularly preferably from 60 to 100 nm.

In the substrate with a conductive film of the present invention, the conductive film 2 may be produced by a known film-forming method such as a sputtering method such as a magnetron sputtering method or an ion beam sputtering method; a CVD method; a vacuum evaporation method; or an electrolysis plating method. For example, in a case of forming a conductive film 2 containing only Cr and N, the conductive film may be formed by a magnetron sputtering method using a Cr target as the target and a mixed gas of Ar and $N_2$ as the sputtering gas.

Further, in a case of forming a conductive film 2 containing other element(s) in addition to Cr and N, the conductive film may be formed by a magnetron sputtering method using a compound target of Cr and other element(s) as a target, or using a Cr target and a target of other element(s) in combination, and using a mixed gas of Ar and $N_2$ as the sputtering gas.

Further, in a case of forming a conductive film having a lamination structure (two layer structure wherein a lower layer contains no N and an upper layer contains N), the lower layer is formed by carrying out a magnetron sputtering method using a Cr target as the target and an Ar gas as the sputtering gas, and thereafter, the upper layer is formed by changing the sputtering gas to a mixed gas of Ar and $N_2$ and carrying out a magnetron sputtering method.

Further, in a case of forming the narrowly-defined gradient composite film, the conductive film may be formed by carrying out a magnetron sputtering method using a Cr target as the target while the ratio of $N_2$ in the sputtering gas (mixed gas of Ar and $N_2$) is adjusted.

Here, in order to prevent oxygen atoms from being contained in a conductive film to be formed, the forming of the conductive film is carried out in an environment containing substantially no gas containing oxygen atoms (such as $O_2$, CO, $CO_2$, $H_2O$ or NO), specifically, in an environment wherein the total partial pressure of gases containing oxygen atoms is at most $1 \times 10^{-4}$ Pa, preferably at most $1 \times 10^{-5}$ Pa.

In order to form a conductive film 2 containing oily Cr and N by the above method, the above method may be carried out under the following film-forming conditions.

Target: a Cr target

Sputtering gas: a mixed gas of Ar and $N_2$ (concentration of $N_2$ gas: 3 to 45 vol %, preferably 5 to 40 vol %, more preferably 10 to 35 vol %; gas pressure: $1.0 \times 10^{-1}$ to $50 \times 10^{-1}$ Pa, preferably $1.0 \times 10^{-1}$ to $40 \times 10^{-1}$ Pa, more preferably $1.0 \times 10^{-1}$ to $30 \times 10^{-1}$ Pa).

Input power: 30 to 1,000 W, preferably 50 to 750 W, more preferably 80 to 500 W.

Film-forming speed: 2.0 to 60 nm/min, preferably 3.5 to 45 nm/min, more preferably 5 to 30 nm/min.

At a time of forming a pattern on an EUV mask blank, that is, in a mask patterning process, the forming of a pattern is usually carried out by using an electron beam lithography technique to form a fine pattern.

In order to form a pattern by using an electron beam lithography technique, first, a surface of an absorptive layer of an EUV mask blank is coated with a resist for electron beam lithography, and it is subjected to a baking treatment at e.g. 200° C. Subsequently, a surface of the resist is irradiated with an electron beam by using an electron beam lithography apparatus, and thereafter, it is subjected to development to form a resist pattern. The mask on which the pattern is formed by the above procedure is used for an exposure process using EUV light. These process steps are carried out in a state that the EUV mask blank (or a mask on which the pattern is formed) is fixed to an electrostatic chuck.

During the above pattern-forming and the exposure to EUV light, the temperature of the substrate increases. A temperature increase in the substrate may adversely affect pattern accuracy, which is not preferred. For this reason, cooling of a substrate during pattern-forming is being considered. Various methods for cooling a substrate are considered, and these methods include a method of cooling a substrate by flowing a liquid or a gas through inside an electrostatic chuck, or a method of cooling a substrate by flowing a gas through a gap between a pin chuck and the substrate. In these methods, from the viewpoint of cooling efficiency, the conductive film 2 is preferably in close contact with the electrostatic chuck to have a high thermal conductivity at the contact portions between both members.

In the substrate with a conductive film of the present invention, the substrate 1 for film-forming has to satisfy the properties required for a substrate of EUV mask blank. Accordingly, the substrate 1 preferably has a low heat expansion coefficient (specifically, a heat expansion coefficient of preferably $0 \pm 0.1 \times 10^{-7}/°$ C., more preferably $0 \pm 0.05 \times 10^{-7}/°$ C., still more preferably $0 \pm 0.03 \times 10^{-7}/°$ C. at 20° C.), and is preferably excellent in smoothness, flatness and durability against a cleaning liquid employed for e.g. cleaning of a mask blank or photomask after patterning.

The substrate 1 may, specifically, be a glass having a low heat expansion coefficient, such as a $SiO_2$—$TiO_2$ type glass, but the material is not limited thereto. For example, it may be a substrate made of e.g. a crystalline glass formed by separating out a β quartz solid solution, a quartz glass, silicon or a metal.

The substrate 1 preferably has a smooth surface having a surface roughness (rms) of at most 0.15 nm, preferably at most 0.12 nm and a flatness of at most 100 nm, preferably at most 80 nm, for the purpose of obtaining a high reflectivity and a high transfer accuracy in a patterned photomask.

The size and the thickness, etc. of the substrate 1 are appropriately determined according to e.g. the design values of the mask. In Examples, a $SiO_2$—$TiO_2$ type glass having an outer dimension of 6 inches (152.4 mm) square and having a thickness of 0.25 inch (6.3 mm) was employed.

Figure 2:
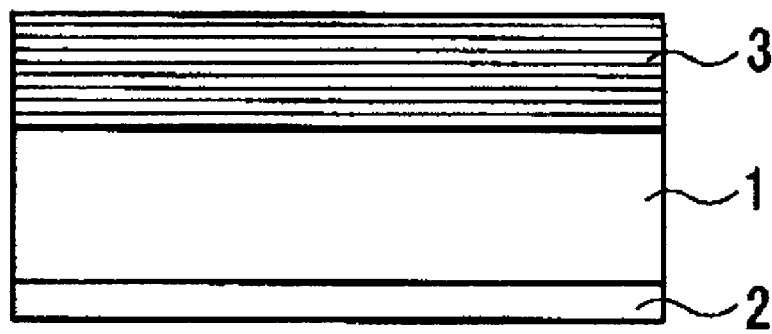
FIG. 2 is a schematic view of a substrate with a multilayer reflective film of the present invention.

Next, a substrate with a multilayer reflective film of the present invention will be described. FIG. 2 is a schematic view of a substrate with a multilayer reflective film of the present invention. As shown in FIG. 2, a multilayer reflective film 3 is formed on a surface of a substrate 1 opposite from a surface on which a conductive film 2 is formed. Here, the substrate 1 and the conductive film 2 are the same as those shown in FIG. 1 (the substrate with a conductive film of the present invention).

The substrate with a multilayer reflective film of the present invention can be obtained by fixing the substrate with a conductive film of the present invention onto an electrostatic chuck, and forming the multilayer reflective film 3 on a film-forming surface of the substrate 1 by using a sputtering method such as a magnetron sputtering method or an ion beam sputtering method.

The multilayer reflective film 3 to be formed on the film-forming surface of the substrate 1 is not particularly limited so long as it has desired properties of a multilayer reflective film of an EUV mask blank. Here, the property particularly required for the multilayer reflective film 3 is that the film is a film having a high reflectivity for EUV light. Specifically, when light in the EUV wavelength region is incident into the surface of the multilayer reflective film, the maximum reflectivity for light having a wavelength in the vicinity of 13.5 nm is preferably at least 60%, more preferably at least 65%.

The multilayer reflective film 3 satisfying the above properties may, for example, be a Si/Mo multilayer reflective film comprising alternately laminated Si films and Mo films; a Be/Mo multilayer reflective film comprising alternately laminated Be and Mo films; a Si compound/Mo compound multilayer film comprising alternately laminated Si compound layers and Mo compound layers; a Si/Mo/Ru multilayer reflective film comprising Si films, Mo films and Ru films that are repeatedly laminated in this order; or a Si/Ru/Mo/Ru multilayer reflective film comprising Si films, Ru films, Mo films and Ru films that are repeatedly laminated in this order.

The procedure for forming the multilayer reflective film 3 on the film-forming surface of the substrate 1 may be a commonly used procedure for forming a multilayer reflective film using a sputtering method. For example, in a case of forming a Si/Mo multilayer reflective film by using an ion beam sputtering method, a Si target is used as the target, an Ar gas (gas pressure is from $1.3 \times 10^{-2}$ to $2.7 \times 10^{-2}$ Pa, preferably from $1.5 \times 10^{-2}$ to $2.5 \times 10^{-2}$ Pa), and sputtering is carried out under an ion acceleration voltage of from 300 to 1,500 V, preferably from 400 to 1,300 V and a film-forming speed of from 0.03 to 0.30 nm/sec, preferably from 0.05 to 0.25 nm/sec, to form a Si film of 4.5 nm thick. Subsequently, it is preferred that using a Mo target as the target and an Ar gas (gas pressure is from $1.3 \times 10^{-2}$ to $2.7 \times 10^{-2}$ Pa) as the sputtering gas, sputtering is carried out under an ion acceleration voltage of from 300 to 1,500 V and a film-forming speed of from 0.03 to 0.30 nm/sec, to form a Mo film of 2.3 nm thick. This cycle is repeated from 40 to 50 cycles to laminate Si films and Mo films to form a Si/Mo multilayer reflective film. In the process of forming the multilayer reflective film 3, in order to form a uniform film, the film-forming is preferably carried out while the substrate 1 is rotated by using a rotator.

In the substrate with a multilayer reflective film of the present invention, the uppermost layer of the multilayer reflective film 3 is preferably a layer of hardly oxidizable material in order to prevent oxidization of the surface of the multilayer reflective film 3. The layer of hardly oxidizable material functions as a cap layer of the multilayer reflective film 3. A specific example of the layer of hardly oxidizable material functioning as a cap layer may be a Si layer. When the multilayer reflective layer is a Si/Mo film, by forming a Si layer as the uppermost layer, the uppermost layer can function as a cap layer. In this case, the film thickness of the cap layer is preferably 11±2 nm.

Since the substrate with a multilayer reflective film of the present invention employs the substrate with a conductive film of the present invention, at a time of forming the multilayer reflective film while the substrate with a conductive film is fixed to an electrostatic chuck, it is possible to prevent the generation of particles due to abrasion between the electrostatic chuck and the conductive film. Accordingly, the substrate with a multilayer reflective film is excellent in that it has extremely few surface defects due to particles.

Figure 3:
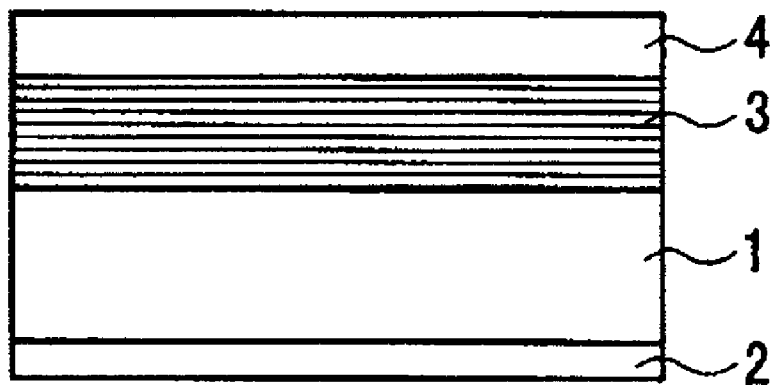
FIG. 3 is a schematic view of an EUV mask blank of the present invention.

Next, the EUV mask blank of the present invention will be described. FIG. 3 is a schematic view of an EUV mask blank of the present invention. In FIG. 3, an absorptive layer 4 is provided on a multilayer reflective film 3. Here, a substrate 1, a conductive film 2 and the multilayer reflective film 3 are the same as those shown in FIG. 2 (the substrate with a multilayer reflective film of the present invention).

The EUV mask blank of the present invention can be obtained by fixing the substrate with a multilayer reflective film of the present invention on an electrostatic chuck, and forming the absorption layer 4 on the multilayer reflective film 3 by using a sputtering method such as a magnetron sputtering method or an ion beam sputtering method.

In the EUV mask blank of the present invention, the absorptive layer 4 formed on the multilayer reflective film 3 is formed of a material having a high absorption coefficient for EUV light, specifically, which may, for example, be Cr, Ta or a nitride of these. Among these, TaN is preferred for the reason that it tends to be amorphous, its surface is excellent in smoothness and it has a small surface roughness. The thickness of the absorptive layer 4 is preferably from 50 to 100 nm, more preferably from 55 to 90 nm. The method for forming the absorptive layer 4 is not particularly limited so long as it is a sputtering method, and it may be a magnetron sputtering method or an ion beam sputtering method.

When a TaN layer is formed as the absorptive layer by using an ion beam sputtering method, a Ta target is used as the target, and a $N_2$ gas (gas pressure is $1.3 \times 10^{-2}$ to $2.7 \times 10^{-2}$ Pa, preferably from $1.5 \times 10^{-2}$ to $2.5 \times 10^{-2}$ Pa) as the sputtering gas, and sputtering is carried out under an ion acceleration voltage of from 30 to 1,500 V, preferably from 400 to 1,300 V, a film-forming speed of from 0.01 to 0.1 nm/sec, preferably from 0.05 to 0.25 nm/sec, to form a film of from 50 to 100 nm thick.

In the process of forming the absorptive layer 4 by using a sputtering method, in order to obtain a uniform film, it is preferred to carry out film-forming while the substrate 1 is rotated by using a rotator.

In the EUV mask blank of the present invention, a buffer layer may be present between the multilayer reflective film 3 and the absorptive layer 4.

A material constituting the buffer layer may, for example, be Cr, Al, Ru, Ta or a nitride of them, that is, $SiO_2$, $Si_3N_4$ or $Al_2O_3$. The thickness of the buffer layer is preferably from 10 to 60 nm, particularly preferably from 20 to 50 nm.

Since the EUV mask blank of the present invention employs the substrate with a multilayer reflective film of the present invention, the multilayer reflective film contains extremely few surface defects due to particles. Moreover, at a time of forming the absorptive layer while the substrate with a multilayer reflective film is fixed onto an electrostatic chuck, it is possible to prevent the generation of particles due to the abrasion between the electrostatic chuck and the conductive film. Accordingly, the absorptive layer also contains extremely few surface defects due to particles.

Further, by patterning the above EUV mask blank, it is possible to form an EUV mask having few surface defects. By reducing the number of defects, it is possible to carry out exposure with few defects, and to improve productivity.

EXAMPLES

From now, the present invention will be further described with reference to Examples, but the present invention should not be construed as limited to these Examples.

Example 1

Formation of Conductive Film

In this Example, a glass substrate of $SiO_2$—$TiO_2$ type glass (having external dimensions of 6 inches (152.4 mm) square and a thickness of 6.3 mm) was used as a substrate 1 for film-forming. This glass substrate has a thermal expansion coefficient of $0.02 \times 10^{-7}$/° C. (at 20° C.; this condition is applicable hereinafter), and a Young's modulus of 67 GPa. This glass substrate was polished to have a smooth surface having a surface roughness (rms) of at most 0.15 nm and a flatness of at most 100 nm.

Next, on the surface of the substrate 1, a conductive film 2 was formed by using a magnetron sputtering method. Specifically, after the inside of a film-forming chamber was evacuated to be a vacuum of at most $1 \times 10^{-4}$ Pa, a magnetron sputtering was carried out by using a Cr target in an atmosphere of a mixed gas of Ar and $N_2$, to form a conductive film 2 of 70 nm thick. The film-forming conditions of the conductive film 2 are as follows.
  Target: Cr target
  Sputtering gas: Mixed gas of Ar and $N_2$ (Ar: 70 vol %: $N_2$: 30 vol %; gas pressure: 0.3 Pa)
  Input power: 150 W
  Film-forming speed: 0.11 nm/sec
  Film thickness: 70 nm
Composition Analysis of Conductive Film The average concentrations of Cr, N, O and C in the conductive film 2 were measured by using an X-ray photoelectron spectrometer. The composition ratio (atomic %) of the conductive film was Cr:N:O=62.1:35.9:2.9. The average concentration of C was 0 atomic %.
Crystal State of Conductive Film The crystal state of the conductive film 2 was checked out by an X-ray diffraction apparatus (X-Ray Diffractmeter manufactured by RIGAKU Corporation). Since a diffraction curve obtained has no sharp peak, it was confirmed that the crystal state of the conductive film 2 was an amorphous structure or a fine crystal structure.
Sheet Resistance of Conductive Film The sheet resistance of the conductive film 2 was measured by using a four-probe meter. The sheet resistance of the conductive film 2 was 20 Ω/□.
Surface Roughness of Conductive Film (rms)

The surface roughness was measured by using a dynamic force mode of an atomic force microscope (SPI-3800 manufactured by Seiko Instruments Inc.). The measurement area of the surface roughness was 1 μm×1 μm, and Si-DF40 (manufactured by Seiko Instruments Inc.) was employed as a cantilever. The surface roughness (rms) of the conductive film 2 was 0.3 nm.
Film-Forming of Multilayer Reflective Film Next, a multilayer reflective film (Si/Mo multilayer reflective film) was formed on a side (film-forming surface) of the substrate 1 opposite from the conductive film 2, by using an ion beam sputtering method. Specifically, by repeating 40 cycle of alternate forming of Si film and Mo film, a Si/Mo multilayer reflective film having a total film thickness of 272 nm ((4.5+2.3)×40) was formed. Finally, a Si layer of 11.0 nm thick was formed as a cap layer.

Here, the film-forming conditions of the Si film and the Mo film are as follows.
Film-Forming Conditions of Si Film
  Target: Si Target (boron-doped)
  Sputtering gas: Ar gas (gas pressure is 0.02 Pa)
  Voltage: 700 V
  Film-forming speed: 0.077 nm/sec
  Film thickness: 4.5 nm
Film-Forming Conditions of Mo Film
  Target: Mo Target
  Sputtering gas: Ar gas (gas pressure is 0.02 Pa)
  Voltage: 700 V
  Film-forming speed: 0.064 nm/sec
  Film thickness: 2.3 nm
Evaluation of Surface Defects The number of particles on the multilayer reflective film formed by the above procedure was measured by using a defect inspection apparatus. As a result, the number of particles was 1.5 particles/cm$^2$, and it was confirmed that very few particles were generated at the time of forming the multilayer reflective film. Here, the number of the particles is the number of the particles having a size of at least 0.15 μm.

Next, on the multilayer reflective film (Si/Mo multilayer reflective film) formed by the above procedure, a TaN layer was formed as an absorptive layer for EUV light by using an ion beam sputtering method, to obtain an EUV mask blank. The film-forming conditions are as follows.
Film-Forming Conditions of TaN Layer
  Target: Ta Target
  Sputtering gas: $N_2$ gas (gas pressure is 0.02 Pa)
  Voltage: 700 V
  Film-forming speed: 0.015 nm/sec
  Film thickness: 70 nm The number of particles on the surface on the absorptive layer of the EUV mask blank obtained by the above procedure, was also measured by the same procedure as the above, and as a result, it was 2.0 particles/cm$^2$, and it was confirmed that the EUV mask blank had few surface defects due to particles.

Example 2

This Example is the same as Example 1 except that the N density (average density) in a conductive film 2 formed on a glass substrate is 19 atomic %.

The film-forming conditions of the conductive film 2 are as follows.
Target: Cr Target
Sputtering gas: Mixed gas of Ar and $N^2$ (Ar: 90 vol %, $N_2$: 10 vol %; gas pressure: 0.3 Pa)
Input power: 150 W
Film-forming speed: 0.14 nm/sec
Film thickness: 70 nm The average concentrations of Cr, N, O and C in the conductive film 2 were measured by the same procedure as that of Example 1, and as a result, the composition ratio (atomic %) of the conductive film 2 was Cr:N:O=78.6:19.6:1.8. The average concentration of C was 0 atomic %.

Further, the crystal state of the conductive film 2 was checked out by using the X-ray diffraction apparatus, and as a result, since there was no sharp peak observed in a diffraction curve obtained, it was confirmed that the crystal state of the conductive film 2 was an amorphous structure or a fine crystalline structure. The sheet resistance of the conductive film 2 was measured in the same method as that of Example 1, and as a result, it was 21Ω/□. The surface roughness (rms) of the conductive film 2 was measured by the same method as that of Example 1, and as a result, it was 0.14 nm.

Further, a Mo/Si multilayer reflective film was formed on the film-forming surface of the substrate 1 by the same procedure as that of Example 1, and the number of the particles on the multilayer reflective film was measured by the defect inspection apparatus. As a result, the number of the particles was 1.5 particles/$cm^2$, and it was confirmed that very few particles were generated at the time of forming the multilayer reflective film.

Next, a TaN layer was formed on the Mo/Si multilayer reflective film to obtain an EUV mask blank. With respect to the EUV mask blank obtained, the number of the particles on the surface of the TaN layer was measured, and as a result, it was 2.0 particles/$cm^2$, and it was confirmed that the EUV mask blank had few surface defects due to particles.

Comparative Example 1

Comparative Example 1 is the same as Example 1 except that the N concentration (average concentration) of a conductive film 2 formed on a glass substrate is more than 40 atomic % (42.5 atomic %). The film-forming conditions of the conductive film 2 are as follows.
Target: Cr Target
Sputtering gas: Mixed gas of Ar and $N_2$ (Ar: 60 vol %; $N_2$: 40 vol %; gas pressure: 0.3 Pa)
Input power: 150 W
Film-forming speed: 0.10 nm/sec
Film thickness: 70 nm The average concentrations of Cr, N, O and C in the conductive film 2 were measured in the same procedure as that of Example 1, and as a result, the composition ratio (atomic %) of the conductive film 2 was Cr:N:O=55.4:42.5:2.1. The average concentration of C was 0 at %.

Further, the crystal state of the conductive film 2 was checked out by using the X-ray diffraction apparatus, and as a result, since a sharp peak(s) were observed in a diffraction curve obtained, it was confirmed that the conductive film 2 had a crystal structure. The sheet resistance of the conductive film 2 was measured by the same method as that of Example 1, and as a result, it was 57Ω/□. The surface roughness (rms) of the conductive film 2 was measured by the same method as that of Example 1, and as a result, it was 0.52 nm.

Further, a Mo/Si multilayer reflective film was formed on the film-forming surface of the substrate 1 in the same procedure as that of Example 1, and the number of particles on the multilayer reflective film was measured by using the defect inspection apparatus. As a result, the number of particles was at least 10 particles/$cm^2$, and it was confirmed that the multilayer reflective film has extremely many surface defects due to particles.

Next, a TaN layer was formed on the Mo/Si multilayer reflective film to obtain an EUV mask blank. With respect to the EUV mask blank obtained, the number of the particles on the surface of the TaN layer was measured, and as a result, it was at least 100 particles/$cm^2$, and it was confirmed that the EUV mask blank had extremely many surface defects due to particles.

Comparative Example 2

Comparative Example 2 is the same as Example, 1 except that a conductive film 2 formed on a glass substrate does not contain N. The film-forming conditions of the conductive film 2 are as follows.
Target: Cr Target
Sputtering gas: Ar gas (gas pressure: 0.3 Pa)
Input power: 150 W
Film-forming speed: 0.4 nm/sec
Film thickness: 70 nm The average concentrations of Cr, N, O and C in the conductive film 2 were measured in the same procedure as that of Example 1, and it was confirmed that the conductive film 2 did not contain N. Here, in the conductive film 2, the average concentration of O was 5.1 atomic % and the average concentration of C was 0 atomic %.

Further, the crystal state of the conductive film 2 was confirmed by using the X-ray diffraction apparatus, and as a result, since a sharp peak(s) were observed in a diffraction curve obtained, it was confirmed that the conductive film 2 had a crystal structure. The sheet resistance of the conductive film 2 was measured by the same method as that of Example 1, and as a result, it was 5.5Ω/□. The surface roughness (rms) of the conductive film 2 was measured by the same method as that of Example 1, and as a result, it was 0.71 nm.

Further, a Mo/Si multilayer reflective film was formed on the film-forming surface of the substrate 1 in the same procedure as that of Example 1, and the number of the particles on the multilayer reflective film was measured by using the defect inspection apparatus. As a result, the number of the particles was at least 15 particles/$cm^2$, and it was confirmed that the multilayer reflective film had extremely many surface defects due to particles.

Next, a TaN layer was formed on the Mo/Si multilayer reflective film to obtain an EUV mask blank. With respect to the EUV mask blank obtained, the number of the particles on the surface of the TaN layer was measured, and as a result, it was at least 100 particles/$cm^2$, and it was confirmed that the EUV mask blank had extremely many surface defects due to particles.

Comparative Example 3

Comparative Example 3 is the same as Example 1 except that film forming conditions of the conductive film 2 are as follows.
Target: Cr Target
Sputtering gas: Mixed gas of Ar and NO (Ar: 88 vol %; NO: 12 atomic %; gas pressure: 0.3 Pa)
Input power: 150 W
Film-forming speed: 0.09 nm/min
Film thickness: 70 nm Average concentrations of Cr, N, O and C in the conductive film 2 were measured in the same procedure as that of Example 1, and as a result, the composition ratio (atomic %) of the conductive film 2 was Cr:N:O=30:28:42. The average concentration of C was 0 at %.

Further, the crystal state of the conductive film 2 was checked out by using the X-ray diffraction apparatus, and as a result, since there was no sharp peak in a diffraction curve obtained, it was confirmed that the crystal state of the conductive film 2 was an amorphous structure or a fine crystal structure. The sheet resistance of the conductive film 2 was measured by the same method as that of Example 1, and as a result, it was 30Ω/□. The surface roughness (rms) of the conductive film 2 was measured by the same method as that of Example 1, and as a result, it was 0.60 nm.

Further, a Mo/Si multilayer reflective film was formed on the film-forming surface of the substrate 1 in the same procedure as that of Example 1, and the number of the particles on the multilayer reflective film was measured by using the defect inspection apparatus. As a result, the number of particles was 10 particles/cm$^2$, and it was confirmed that very few particles were generated at the time of forming the multilayer reflective film.

Next, a TaN layer was formed on the Mo/Si multilayer reflective film to obtain an EUV mask blank. With respect to the EUV mask blank obtained, the number of the particles on the surface of the TaN layer was measured, and as a result, it was 100 particles/cm$^2$, and it was confirmed that the EUV mask blank had few surface defects due to particles.

Comparative Example 4

Comparative Example 4 is the same as Example 1 except that the N concentration (average concentration) of a conductive film formed on a glass substrate exceeds 40 atomic % (44.0 atomic %). The film forming conditions of the conductive film 2 are as follows.
  Target: Cr Target
  Sputtering gas: Mixed gas of Ar and N$_2$ (Ar: 50 vol %; N$_2$: 50 vol %; gas pressure: 0.3 Pa)
  Input power: 150 W
  Film-forming speed: 0.097 nm/sec
  Film thickness: 70 nm Average concentrations of Cr, N, O and C in the conductive film 2 were measured in the same procedure as that of Example 1, and as a result, the composition ratio (atomic %) of the conductive film 2 was Cr:N:O=52.0:44.0:4.0. The average concentration of C was 0 at %.

Further, the crystal state of the conductive film 2 was checked out by using the X-ray diffraction apparatus, and as a result, since no sharp peak was observed in a diffraction curve obtained, it was confirmed that the crystal state of the conductive film 2 was an amorphous structure or a fine crystal structure. The sheet resistance of the conductive film 2 was measured by the same method as that of Example 1, and as a result, it was 589Ω/□. The surface roughness (rms) of the conductive film 2 was measured by the same method as that of Example 1, and as a result, it was 0.39 nm.

Further, a Mo/Si multilayer reflective film was formed on a film-forming surface of a substrate 1 in the same procedure as that of Example 1, and the number of the particles on the multilayer reflective film was measured by using the defect inspection apparatus. As a result, the number of the particles was at least 15 particles/cm$^2$, and it was confirmed that the multilayer reflective film had extremely many surface defects due to particles.

Next, a TaN layer was formed on the Mo/Si multilayer reflective film to obtain an EUV mask blank. With respect to the EUV mask blank obtained, the number of the particles on the surface of the TaN layer was measured, and as a result, it was at least 100 particles/cm$^2$, and it was confirmed that the EUV mask blank had extremely many surface defects due to particles.

Comparative Example 5

Comparative Example 5 is the same as Example 1 except that the N concentration (average concentration) of a conductive film 2 formed on a glass substrate exceeds 40 atomic % (45.1 atomic %). The film-forming conditions of the conductive film 2 are as follows.
  Target: Cr Target
  Sputtering gas: Mixed gas of Ar and N$_2$ (Ar: 25 vol %; N$_2$: 75 vol %; gas pressure: 0.3 Pa)
  Input power: 150 W
  Film-forming speed: 0.073 nm/sec
  Film thickness: 70 nm Average concentrations of Cr, N, O and C in the conductive film 2 were measured in the same procedure as that of Example 1, and as a result, the composition ratio (atomic %) of the conductive film 2 was Cr:N:O=52.0:45.1:2.9. The average concentration of C was 0 at %.

Further, the crystal state of the conductive film 2 was checked out by using the X-ray diffraction apparatus, and as a result, since no sharp peak was observed in a diffraction curve obtained, it was confirmed that the crystal state of the conductive film 2 was an amorphous structure or a fine crystal structure. The sheet resistance of the conductive film 2 was measured by the same method as that of Example 1, and as a result, it was 1,507Ω/□. The surface roughness (rms) of the conductive film 2 was measured by the same method as that of Example 1, and as a result, it was 0.49 nm. Although the crystal state of the conductive film 2 was an amorphous structure or a fine crystal structure, the surface roughness was considered to be deteriorated since the film quality became rough.

Further, a Mo/Si multilayer reflective film was formed on the film-forming surface of a substrate 1 in the same procedure as that of Example 1, and the number of the particles on the multilayer reflective film was measured by using the defect inspection apparatus. As a result, the number of the particles was 20 particles/cm$^2$, and it was confirmed that the multilayer reflective film had extremely many surface defects due to particles.

Next, a TaN layer was formed on the Mo/Si multilayer reflective film to obtain an EUV mask blank. With respect to the EUV mask blank obtained, the number of the particles on the surface of the TaN layer was measured, and as a result, it was at least 100 particles/cm$^2$, and it was confirmed that the EUV mask blank had extremely many surface defects due to particles.

Comparative Example 6

Comparative Example 6 is the same as Example 1 except that the N concentration (average concentration) of a conductive film 2 formed on a glass substrate exceeds 40 atomic % (47 atomic %). Film-forming conditions of the conductive film 2 are as follows.
  Target: Cr Target
  Sputtering gas: N$_2$ gas (gas pressure: 0.3 Pa)
  Input power: 150 W
  Film-forming speed: 0.063 nm/sec
  Film thickness: 70 nm Average concentrations of Cr, N, O and C in the conductive film 2 were measured in the same procedure as that of Example 1, and as a result, the composition ratio (atomic %) of the conductive film 2 was Cr:N:O=51.5:46.8:1.7. The average concentration of C was 0 at %.

Further, the crystal state of the conductive film 2 was confirmed by using the X-ray diffraction apparatus, and as a result, since no sharp peak was observed in a diffraction curve obtained, it was confirmed that the crystal state of the conductive film 2 was an amorphous structure or a fine crystal structure. The sheet resistance of the conductive film 2 was measured by the same method as that of Example 1, and as a result, it was 614Ω/□. The surface roughness (rms) of the conductive film 2 was measured by the same method as that of Example 1, and as a result, it was 0.81 nm. Although the crystal state of the conductive film 2 was an amorphous structure or a fine crystal structure, the surface roughness was considered to be deteriorated since the film quality became rough.

Further, a Mo/Si multilayer reflective film was formed on the film-forming surface of the substrate 1 in the same procedure as that of Example 1, and the number of the particles on the multilayer reflective film was measured by using the defect inspection apparatus. As a result, the number of the particles was at least 20 particles/cm$^2$, and it was confirmed that the multilayer reflective film had extremely many surface defects due to particles.

Next, a TaN layer was formed on the Mo/Si multilayer reflective film to obtain an EUV mask blank. With respect to the EUV mask blank obtained, the number of the particles on the surface of the TaN layer was measured, and as a result, it was at least 100 particles/cm$^2$, and it was confirmed that the EUV mask blank had extremely many surface defects due to particles.

INDUSTRIAL APPLICABILITY

The present invention improves contact between an electrostatic chuck and a substrate with a conductive film, and thereby enables to provide a substrate with a conductive film for EUV mask blank in which the generation of particles due to abrasion between the electrostatic chuck and the substrate is prevented, and to thereby provide an EUV mask blank in which the deterioration of pattern accuracy hardly occurs and which has a long lifetime. These features are useful for a photolithography method using EUV light as a transfer technique of fine patterns required for forming integrated circuits constituted by the fine patterns on e.g. a Si substrate.

The entire disclosure of Japanese Patent Application No. 2006-338576 filed on Dec. 15, 2006 including specification, claims, drawings and summary is incorporated herein by reference in its entirety.

What is claimed is:

1. A substrate for a reflective mask blank for EUV lithography, comprising:
   a substrate; and
   a conductive film formed on the substrate, the conductive film comprising Cr and N, the average concentration of N in the conductive film being at least 0.1 atomic % and less than 40 atomic %, the crystal state of at least a surface of the conductive film being amorphous, and the surface roughness (rms) of the conductive film being at most 0.5 nm.

2. The substrate according to claim 1, wherein the conductive film further comprises at least one element selected from the group consisting of Al, Ag, B, Co, Cu, Fe, Hf, In, Mo, Ni, Nb, Si, Ta, Ti, Zn and Zr in an amount of from 1 to 20 atomic % (average concentration) in total.

3. The substrate according to claim 1, wherein the conductive film further contains at least one element selected from the group consisting of Mo and Ta in an amount of from 1 to 20 atomic % (average concentration) in total.

4. The substrate with a conductive film according to claim 1, wherein the conductive film has a sheet resistance of at most 27 Ω/□.

5. The substrate according to claim 1, wherein the conductive film has a surface roughness (rms) of at most 0.3 nm.

6. The substrate according to claim 1, wherein the crystal state of a portion of the conductive film within 10 nm from a surface in the thickness direction is amorphous.

7. The substrate according to claim 1, wherein the conductive film has a surface hardness of at least 7.5 GPa.

8. The substrate according to claim 1, wherein the conductive film has a surface hardness of within a range of ±4.5 GPa with respect to a surface hardness of an electrostatic chuck to be used.

9. The substrate according to claim 1, wherein the average concentration of O in the conductive film is at most 15 atomic %, and the average concentration of C in the conductive film is at most 10 atomic %.

10. The substrate according to claim 1, wherein the thickness of the conductive film is from 50 to 200 nm.

11. The substrate according to claim 1, wherein the conductive film is a gradient composite film wherein the average concentration of N changes in the thickness direction of the conductive film so that the average concentration of N in a substrate side is low and the average concentration of N in a surface side is high.

12. The substrate with a multilayer reflective film for a reflective mask blank for EUV lithography, which is the substrate as defined in claim 1, further comprising a multilayer reflective film formed on a surface of the substrate opposite from a surface on which the conductive film is formed.

13. A reflective mask blank for EUV lithography, which is the substrate with a multilayer reflective film as defined in claim 12, further comprising an absorptive layer formed on the multilayer reflective film of the substrate with a multilayer reflective film.

14. A reflective mask for EUV lithography produced by patterning the reflective mask blank for EUV lithography as defined in claim 13.

* * * * *